(12) United States Patent
Vakhshoori et al.

(10) Patent No.: US 6,804,270 B1
(45) Date of Patent: Oct. 12, 2004

(54) EFFICIENT FIBER-SEMICONDUCTOR TUNABLE LASER SOURCE

(75) Inventors: Daryoosh Vakhshoori, Cambridge, MA (US); Min Jiang, Acton, MA (US)

(73) Assignee: Coretek Inc.

( * ) Notice: Subject to any disclaimer, the term of this patent is extended or adjusted under 35 U.S.C. 154(b) by 210 days.

(21) Appl. No.: 09/910,402

(22) Filed: Jul. 20, 2001

Related U.S. Application Data

(60) Provisional application No. 60/220,070, filed on Jul. 21, 2000.

(51) Int. Cl.[7] .................................................. H01S 3/10
(52) U.S. Cl. ............................. 372/20; 372/45; 372/43
(58) Field of Search .............................. 372/20, 45, 43

(56) References Cited

U.S. PATENT DOCUMENTS

| | | | |
|---|---|---|---|
| 6,263,002 B1 * | 7/2001 | Hsu et al. .......................... 372/6 |
| 6,445,495 B1 * | 9/2002 | Walker et al. ............... 359/344 |
| 6,611,546 B1 * | 8/2003 | Garnache et al. ............. 372/92 |
| 6,717,964 B2 * | 4/2004 | Jiang et al. .................... 372/20 |
| 2003/0002138 A1 * | 1/2003 | DeCusatis et al. ........... 359/334 |
| 2003/0002545 A1 * | 1/2003 | Jiang et al. .................... 372/20 |

\* cited by examiner

Primary Examiner—Don Wong
Assistant Examiner—Dung (Michael) T Nguyen
(74) Attorney, Agent, or Firm—Steubing McGuinness & Manaras LLP

(57) ABSTRACT

An efficient high power tunable laser source suitable for use in optical communications equipment and networks comprises an optically pumped VCSEL and a fiber amplifier for the laser output of said VCSEL, with VCSEL and the fiber amplifier being optically pumped by a common optical pump source.

16 Claims, 4 Drawing Sheets

EFFICIENT FIBER-SEMICONDUCTOR TUNABLE LASER SOURCE

REFERENCE TO PENDING PRIOR PATENT APPLICATION

This patent application claims benefit of pending prior U.S. Provisional Patent Application Serial No. 60/220,070, filed Jul. 21, 2000 by Daryoosh Vakhshoori et al. for Efficient Fiber-Semiconductor Tunable Laser Source, which patent application is hereby incorporated herein by reference.

FIELD OF THE INVENTION

This invention relates to tunable laser sources and more particularly to laser sources comprising optically pumped tunable vertical cavity surface emitting diode lasers and optical fiber amplifiers.

BACKGROUND OF THE INVENTION

Single mode optical fibers doped with rare-earth elements are well known for their high efficiency. However, lasers made with doped fibers as gain medium bear challenges in cavity stabilization. Usually a sophisticated and complex scheme has to be employed in order to obtain a stable and high quality spectral output. A vertical cavity surface emitting laser (VCSEL) with a movable mirror has the advantage of providing a wide tuning range with high quality spectral output, but the efficiency of the VCSEL tends to be limited due to low gain of the cavity. The maximum possible power from an optically pumped VCSEL is further restricted by the difficulty of dissipating heat, which tends to limit full use of the increasingly high power available from single mode pump diodes.

SUMMARY OF THE INVENTION

The primary object of the invention is to provide an efficient, high power and high quality tunable laser source.

A further object is to extend the capabilities of optically pumped tunable vertical cavity surface emitting diode lasers.

Still another object is utilize a doped fiber amplifier to increase the power output of an optically pumped VCSEL.

These and other objects are achieved by providing a laser source that comprises in combination a VSCEL, a doped optical gain fiber, a pump laser, and means coupling said pump laser, said VCSEL and said fiber whereby said VCSEL and said fiber are optically pumped by the output of said pump laser and the output of said vertical cavity surface emitting laser is injected into said fiber and is amplified in said fiber by the output of said pump laser. Other features and advantages of the invention will be made clear by the following detailed description which is to be considered together with the accompanying drawings.

THE DRAWINGS

In the drawings, like components are identified by like numerals.

A SPECIFIC DESCRIPTION OF THE INVENTION

The several embodiments hereinafter described combine the advantages of a VCSEL with the advantages of doped optical gain fibers, thereby providing economical, efficient, high power and high quality tunable laser sources.

Figure 1:
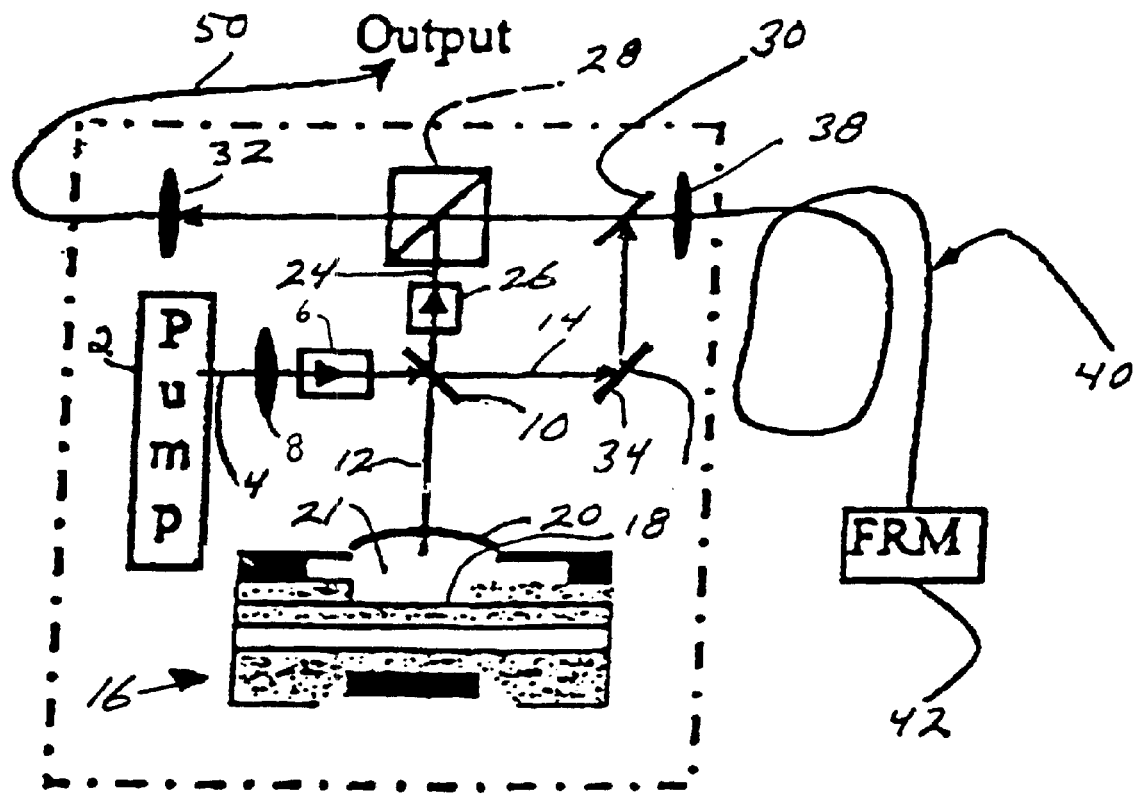
FIG. 1 illustrates an amplified tunable VCSEL constituting a first and preferred embodiment of the invention.

Referring now to FIG. 1, the illustrated apparatus comprises a pump laser 2 which emits a spatial single mode beam 4 at a wavelength λ1. That beam is preferably collimated by a lens 8 and passes an optical isolator 6. The latter directs beam 4 at a diachronic beam splitter 10 which effectively subdivides the beam power, with part of beam 4 being reflected as a beam 12 with wavelength λ1 and the remainder of beam 4 passing through the beam splitter as laser beam 14 with wavelength λ1. The beam 12 is directed by the beam splitter 10 into a VCSEL represented schematically at 16. Various forms of VCSELs may be used in practicing this invention. Preferably the VCSEL has a structure like one of those described in co-pending U.S. patent application Ser. No. 09/281,407, filed Mar. 30, 1999 by Daryoosh Vakhahoori et al. for "Optically Pumped Tunable Surface Emitting Lasers", and U.S. patent application Ser. No. 09/105,399, filed Jun. 26, 1998 by Tayebati et al. for "Microelectromechanically Tunable, Confocal, Vertical Cavity Surface Emitting Laser and Fabry-Perot Filter", which applications are incorporated herein by reference. Still other forms of VCSELs known to persons skilled in the art may be used in practicing the invention.

The VCSEL 16 has a fixed mirror 18 and a movable cavity mirror 20 at opposite ends of a cavity 21, plus electrodes (not shown) for electrically tuning the device. In the VCSEL, wavelength tuning is achieved by moving mirror 20 so as to vary the laser cavity length. In FIG. 1, beam splitter 10 is located along the optical axis of the VCSEL as shown, so as to maximize the optical coupling of beam 12 with the VCSEL and avoid the need for intervening optics. The pump laser beam 12 at wavelength λ1 passes into the cavity via mirror 20 to optically pump the VCSEL and cause the latter to produce an output beam 24 at wavelength λ2 that exits via mirror 20. The splitter 10 is designed and disposed so that it will pass VCSEL laser beam 24, while at the same time splitting pump laser beam 4 as described. In this connection, it is to be noted that the VCSEL output beam 24 is polarized as a result of well controlled birefringence of the VCSEL. The VCSEL laser output beam 24 passes from splitter 10 via an optical isolator 26 into a polarization dependent high reflector/beam splitter represented schematically at 28 which is interposed between a diachronic mirror 30 and an output focusing lens 32. Splitter 28 is adapted to reflect the polarized VCSEL beam 24 to mirror 30. The latter is adapted to pass VCSEL beam 24 to a focusing lens 38 and also to reflect pump laser beam 14 as hereinafter described.

The laser apparatus of FIG. 1 further includes a highly reflective mirror 34 which is disposed to receive λ1 wavelength beam 14 and to reflect it to diachronic mirror 30. The latter in turn reflects beam 14 to focusing lens 38. The latter transmits VCSEL beam 24 and pump laser beam 14 into one end of a doped high gain optical fiber 40. The opposite end of the fiber is coupled to a Faraday rotator mirror 42 which reflects the VCSEL beam back along the fiber toward beam splitter 28 and also serves to rotate the VCSEL beam polarization 90 degrees so that it can pass through beam splitter 28 to output lens 32.

Operation of the laser system of FIG. 1 is as follows. The VCSEL 16 responds to the pump laser beam 12 at wavelength λ1 by generating VCSEL laser beam 24 at wavelength λ2. The VCSEL laser beam passes through the beam splitter 10 and isolator 26 to beam splitter 28, which then reflects the beam to diachronic mirror 30. The VCSEL beam passes through mirror 30 and is transmitted by the focusing lens 38 into the high gain fiber 40. The pump laser is chosen with an output beam wavelength λ1 that will effectively pump the doped gain fiber 40, which typically has a relatively narrow absorption band. In this connection it is to be noted that the VCSEL, being made from a semiconductor, has a wide tolerance for the wavelength of the pump laser in relation to its response to the pump laser beam.

The illustrated apparatus of FIG. 1 experiences maximum amplification due to the fact that the laser beam output of the VCSEL essentially has a double transit along the length of high gain fiber 40. As noted above, the VCSEL beam 24 has a selected polarization as it passes from splitter 10 that allows it to be reflected by beam splitter 28. However, the Faraday rotator mirror 42 rotates the polarization of the VCSEL output beam 90 degrees, with the result that on its return transit along gain fiber 40 the beam passes through splitter 28 and is extracted from the system by passing through output focusing lens 32 to an output port. By way of example but not limitation, the output port may comprise an optical fiber 50.

Figure 2:
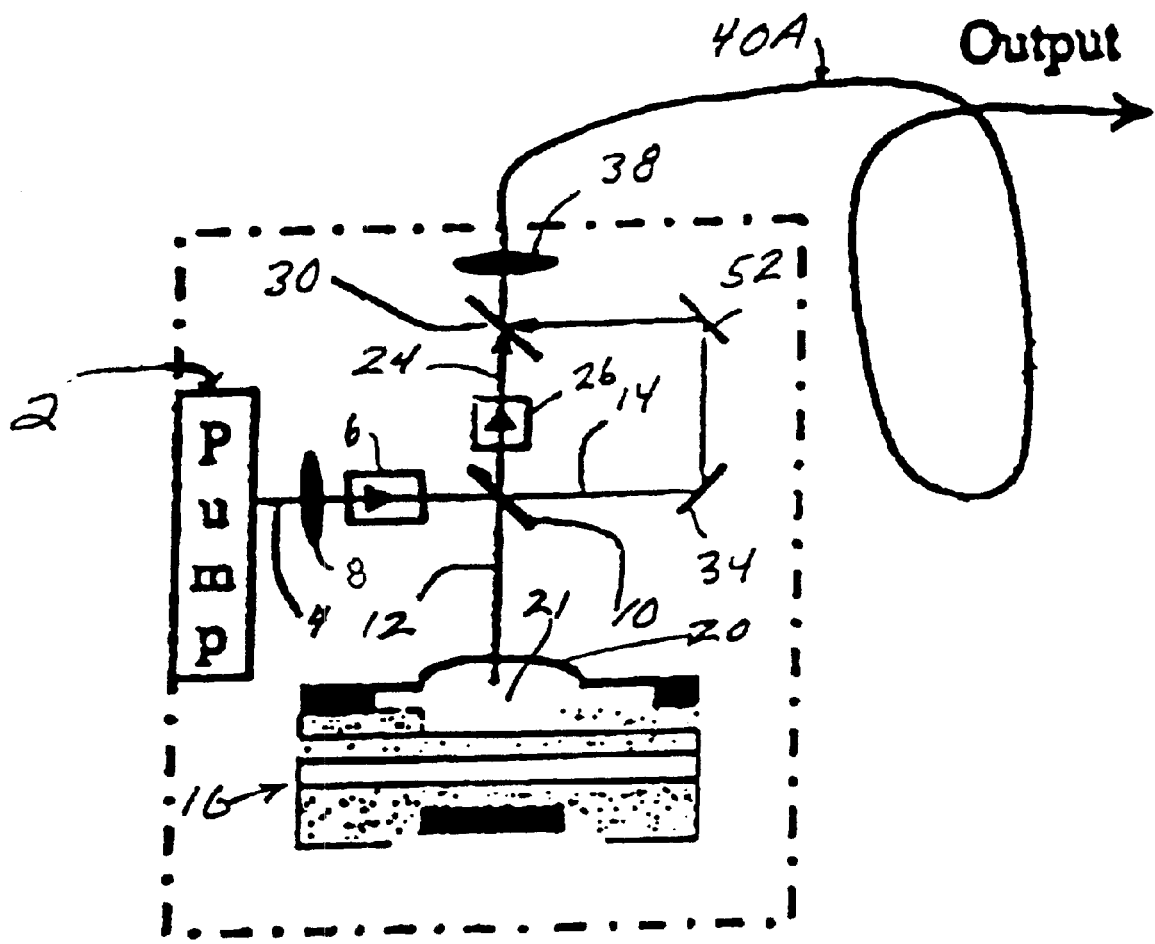
FIG. 2 illustrates a second embodiment of the invention.

FIG. 2 illustrates an alternative embodiment of the invention. In this arrangement, the beam splitter 28 is omitted and the VCSEL output beam 24 passes directly to diachronic mirror 30. Beam 24 passes through mirror 30 to focusing lens 38. Additionally a highly reflective mirror 52 is positioned to reflect pump laser beam 14 received from mirror 34 and to direct it to diachronic mirror 30 which is positioned so as to reflect beam 14 to focusing lens 38. The latter directs the combined beams 14 and 24 into one end of a single mode high gain fiber 40A which also serves as the output line.

Operation of the embodiment of FIG. 2 is as follows. The VCSEL output beam 24 at wavelength $\lambda 2$ is transmitted via the isolator 26 to diachronic mirror 30 which passes it into the high gain fiber 40A. Simultaneously the pump laser beam 14 at a wavelength $\lambda 1$ is injected into the high gain fiber via reflections by mirrors 34, 52 and 30 to provide amplification for the VCSEL output beam. As a result the $\lambda 2$ wavelength output beam that exits the remote end of the high gain fiber line 40A has a greater power than the original output beam of the VCSEL.

Figure 3:
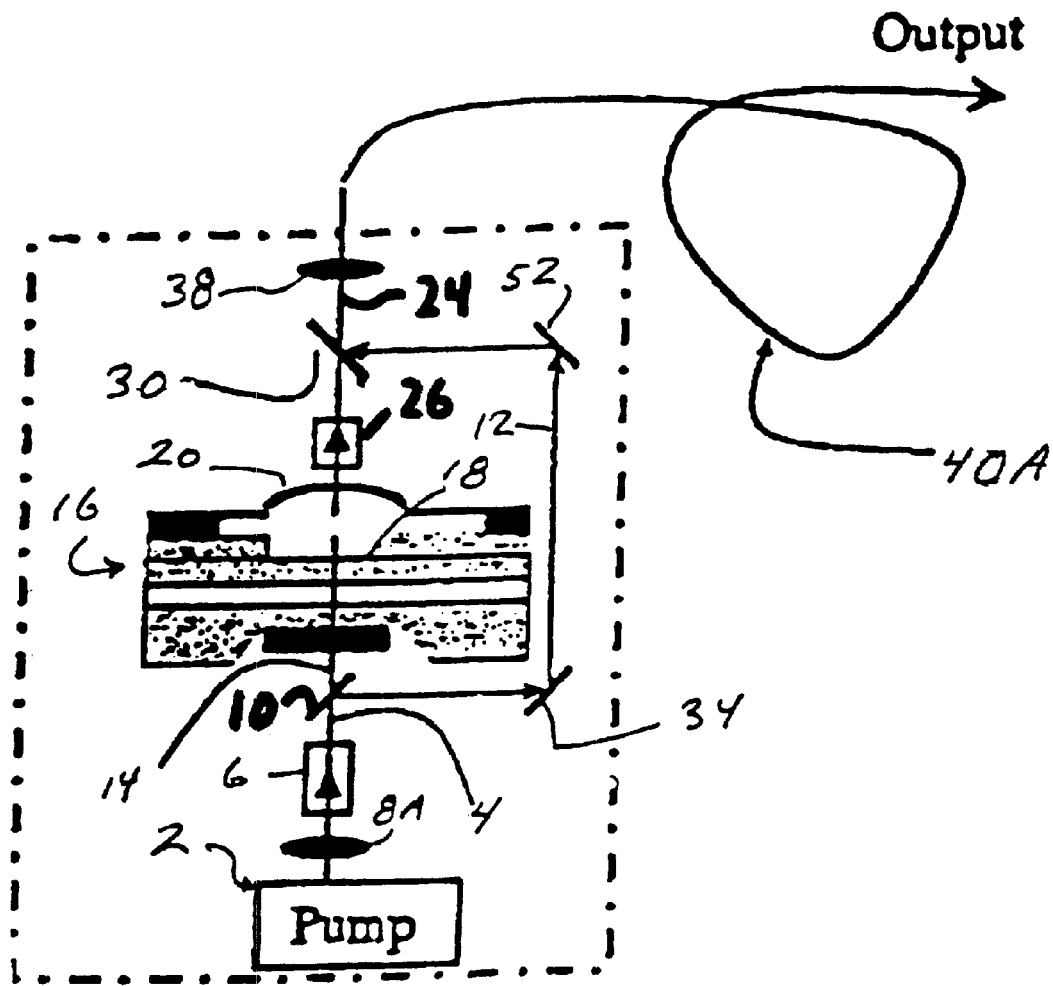
FIG. 3 illustrates a third embodiment of the invention.

FIG. 3 illustrates still another embodiment of the invention. In this case pump laser 2, a collimating lens 8A, isolator 6 and diachronic beam splitter 10 are disposed so as to optically pump the VCSEL 16 via transit through its fixed mirror 18. Beam splitter 10 splits the $\lambda 1$ wavelength pump laser beam 4 into beams 12 and 14. The pump laser beam 14 is injected into the VCSEL via the stationary mirror 18, causing the VCSEL to produce a laser output beam 24 with wavelength $\lambda 2$. That beam passes through diachronic mirror 30 to a focusing lens 38 which couples the beam into one end of single mode optical gain fiber 40A which also serves as the output line. The system of FIG. 3 also includes mirrors 34 and 52 which are arranged to intercept, reflect and direct pump laser beam 12 to the diachronic chronic mirror 30 at an angle such that it will be reflected to focusing lens 38 and directed thereby into the proximal end of gain fiber 40A. Pump laser beam 12 acts on high gain fiber 40A to amplify the power of the VCSEL beam injected into fiber 40A.

Figure 4:
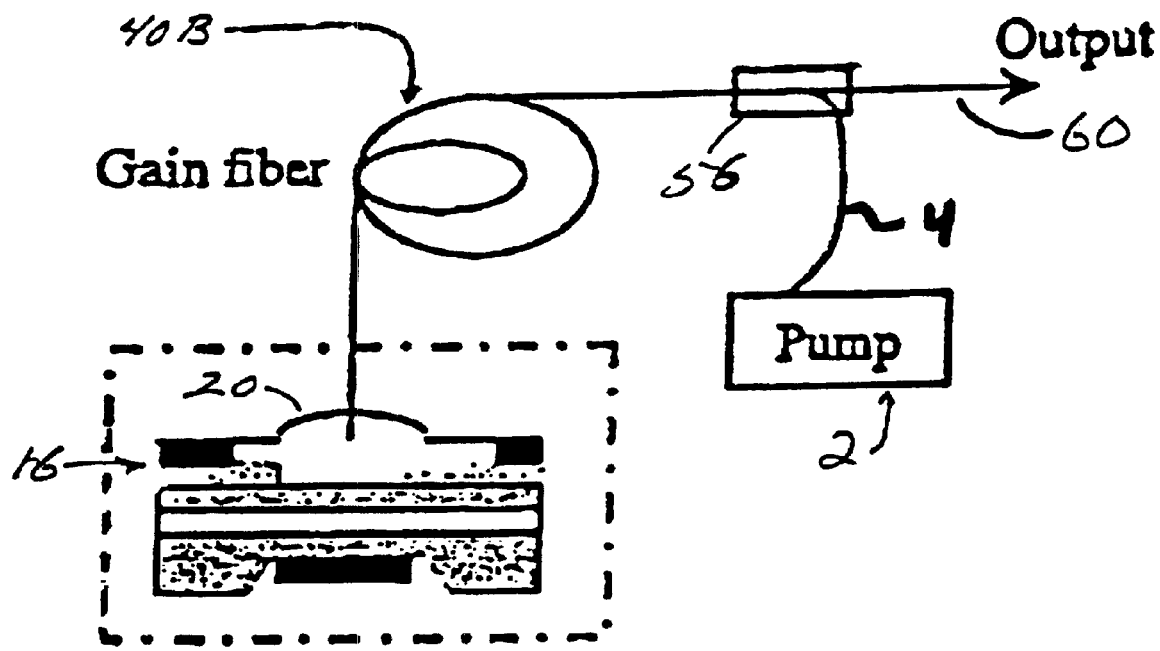
FIG. 4 illustrates a fourth embodiment of the invention.

FIG. 4 shows a fourth embodiment of the invention. In this case a single mode high gain fiber 40B is coupled at one end to an external wavelength division multiplexer 56. The near end of the fiber 40B is disposed so as to be optically coupled to VCSEL 16, whereby (a) the VCSEL may be pumped by a pump laser beam as hereinafter described and (b) the $\lambda 2$ wavelength output beam of the VCSEL is injected into the near end of the gain fiber. The manner in which the fiber 40B is optically coupled for injection therein of the laser output of the VCSEL is not critical to the invention; therefore, optical coupling of fiber 40B to the VCSEL may be accomplished in various ways known to persons skilled in the art without departing from the invention. A pump laser 2 is provided for producing a pump laser beam at wavelength $\lambda 1$, and injection of that pump laser beam into fiber 40B is accomplished via a wavelength division multiplexer 56 which is coupled to the outer end of gain fiber 40B. The exact form of the multiplexer is not critical to the invention and various forms of multiplexers known to persons skilled in the art may be used in practicing the embodiment shown in FIG. 4. The multiplexer serves several purposes. It injects the pump laser beam 4 into the high gain fiber 40B, whereby to provide amplification for the VCSEL's laser output. It also serves as the system's output port for the VCSEL's amplified laser beam, whereby that beam may be coupled to another device or system, e.g., via an optical fiber 60.

Operation of the system of FIG. 4 is as follows. The pump laser 2 injects a pump laser beam with a selected wavelength $\lambda 1$ into fiber 40B via the multiplexer 56. The injected pump laser beam is injected via the fiber into the VCSEL, causing the latter to generate a laser output at a wavelength $\lambda 2$ which then travels along the fiber to the output port of the multiplexer. As the output from the VCSEL travels to the multiplexer, it is amplified by the counter-propagating pump beam in the gain fiber. Consequently the power level of the VCSEL output appearing at the output port of the multiplexer 56 is substantially greater than that of the VCSEL beam that is injected into the near end of the fiber. The amplified VCSEL beam that exits the output port of the multiplexer 56 may be coupled to an external optical system for use, e.g., to an optical communications network.

The configuration of FIG. 4 offers the advantage of simplicity and high amplification relative to the co-propagating configuration of FIGS. 2 and 3. The maximum amplification of the embodiment of FIG. 4 is restricted by the feedback between the VCSEL and the wavelength division multiplexer, which much be kept very low to prevent lasing from the fiber amplifier.

The invention hereinabove described and illustrated offers the advantage of providing an efficient tunable laser source combined with the advantages of a VCSEL and a fiber amplifier, with the result that laser sources as provided by this invention have utility in optical data and communication equipment and networks.

The present invention may also be practiced otherwise than as herein described and illustrated. For example, use of the optical isolators 6 and 26, which serve to suppress optical interference between the components, is preferred but is not essential to the invention. Additionally the optics coupling the VCSEL laser, pump laser and high gain fiber may be varied in various ways without departing from the essence of the invention. It is understood also that the pump lasers with outputs of different wavelengths values may be used in practicing the invention, provided, however, that they are suitable for adequately optically pumping the VCSELs. The injection of the pump beam of wavelength $\lambda 1$ to the VCSEL and the output of the VCSEL at wavelength $\lambda 2$ may be coupled via various forms depending on the design of the cavity mirrors.

The invention is susceptible of still other modifications that will be obvious to persons skilled in the art from the foregoing description and the drawings.

What is claimed is:

1. A fiber-semiconductor laser source comprising:
   an optical pump source producing a pump laser output at a given wavelength,
   an optically pumped tunable VCSEL coupled with the optical pump source to receive a first portion of the pump laser output and, in response, provide an output,
   a fiber amplifier, and
   coupling optics coupled with the optical pump source, the VCSEL, and the fiber amplifier so as to receive and combine the VCSEL output and a second portion of the pump laser output, and provide the combined output to the fiber amplifier
   whereby said VCSEL output is combined with a portion of the optical pump source not provided to the VCSEL.

2. A laser source according to claim 1 wherein said optical pump source produces said pump laser output with a wavelength $\lambda 1$ and said VCSEL produces a VCSEL laser output with a wavelength $\lambda 2$.

3. A laser source according to claim 2 wherein said optical pump source is a diode laser.

4. A laser source according to claim 3 further including means for deriving first and second pump laser beams from the laser output of said diode laser, first means for injecting said first laser beam into said VCSEL and second means for injecting said second laser beam into said fiber amplifier.

5. A laser source according to claim 4 wherein said fiber amplifier comprises a doped optical fiber, and further including means for injecting said VCSEL laser output into said fiber and means for extracting the amplified VCSEL laser output from said fiber.

6. A laser source according to claim 1 wherein said fiber amplifier comprises a doped optical fiber having one end disposed to inject said pump laser output into said VCSEL whereby to cause said VSCEL to produce said VCSEL laser output, and further including a multiplexer connected to the opposite end of said doped optical fiber and coupled to said optical pump source for (a) injecting said pump laser output into said fiber and (b) coupling said VCSEL laser output to an optical device.

7. An efficient laser source comprising a pump laser for emitting a pump laser beam at a wavelength $\lambda 1$, a tunable vertical cavity surface emitting laser (VCSEL), an optical coupler for directing said pump laser beam into said VCSEL so as to cause said VCSEL to emit a VCSEL laser beam at a wavelength $\lambda 2$, an optical gain fiber, and light coupling optics configured for (a) directing said VCSEL laser beam at wavelength $\lambda 2$ into said optical gain fiber and (b) injecting said pump laser beam at wavelength $\lambda 1$ into said optical gain fiber so as to provide amplification for said VCSEL laser beam.

8. A laser source according to claim 7 wherein said pump laser beam is collimated, and further wherein said light coupling means comprises:

a first diachronic beam splitter which is adapted to reflect and transmit light of wavelength $\lambda 1$ and to transmit light of wavelength $\lambda 2$, said beam splitter being disposed so as to reflect a portion of said pump laser beam into said VCSEL and also to receive and transmit the VCSEL laser beam emitted by said VCSEL;

a second polarization dependent beam splitter disposed to receive the VCSEL laser beam output from first beam splitter, said second beam splitter being adapted to reflect said VCSEL laser beam according to a first VCSEL beam polarization and to, transmit said same laser beam according to a second polarization rotated 90 degrees from said first beam polarization;

an optical coupler configured for receiving said VCSEL laser beam reflected by said second beam splitter and injecting same into one end of said optical gain fiber;

reflector means for injecting said pump laser beam into said optical gain fiber;

a Faraday rotator mirror coupled to the opposite end of said optical gain fiber for receiving the VCSEL laser beam reflected from said second beam splitter, rotate the beam polarization by 90 degrees, and reflect the VCSEL beam with rotated polarization back along optical gain fiber for transmittal through said second beam splitter; and an output coupler configured for receiving the reflected VCSEL laser beam with rotated polarization that is transmitted through said second beam splitter.

9. An improved laser source comprising:

a tunable vertical cavity surface emitting laser (VCSEL);

a pump laser for generating a single mode output beam at a wavelength $\lambda 1$;

diachronic beam splitter means for receiving said pump laser output beam and dividing the power of that beam so as to form a first and second beams of like wavelength $\lambda 1$, said beam splitter being positioned so that only said first beam is injected into said VCSEL, said VCSEL being operative in response to said first beam to emit a VCSEL laser beam at a wavelength $\lambda 2$;

an optical gain fiber; and light coupling optics configured for coupling the VCSEL laser beam with the second beam and directing the coupled beams into said optical gain fiber, whereby said VCSEL laser beam is combined with a portion of the pump laser output not provided to the VCSEL so as to provide amplification for said VSCEL laser beam.

10. An improved laser source according to claim 9 wherein said second beam of wavelength $\lambda 1$ is coupled to said gain fiber by reflection from a plurality of mirrors.

11. An improved laser source according to claim 9 wherein said VCSEL has a movable mirror and a fixed internal mirror aligned with its vertical cavity, and further wherein said pump laser and said beam splitter are arranged so as to couple said first beam of wavelength $\lambda 1$ to said VSCEL via transmittal through said fixed mirror.

12. An improved laser source according to claim 9 wherein said VCSEL has a movable mirror and a fixed internal mirror aligned with its vertical cavity, and further wherein said pump laser and said beam splitter are arranged so as to couple said first beam of wavelength $\lambda 1$ to said VSCEL via said transmittal through said movable mirror.

13. An improved laser source according to claim 9 wherein said light coupling means comprises a diachronic mirror disposed so as to receive said VSCEL laser beam and said second beam from said pump laser and to direct them into said optical gain fiber.

14. An improved laser source according to claim 9 further including an optical lens for directing said VSCEL laser beam and said second beam from said pump laser into one end of said optical gain fiber.

15. As improved laser source comprising:

a tunable vertical cavity surface emitting laser (VCSEL);

an optical gain fiber having one end optically coupled to the output side of said VCSEL;

a pump laser for generating a single mode pump laser beam at a wavelength $\lambda 1$; and a wavelength division multiplexer having first and second input ports and an output port, with said first input port coupled to said gain fiber and said second input port coupled to said pump laser, said multiplexer configured for (a) injecting said pump laser beam from said second input port into said gain fiber so as to optically pump said VCSEL optically coupled to said output gain fiber and thereby cause it to emit a VCSEL laser beam that is injected into said one end of said gain fiber, and (b) passing said VCSEL laser beam from said gain fiber to said output port for extraction from said source, said VCSEL laser beam being amplified by said gain fiber during its transit from said one end to said output port, whereby the output of the pump laser transits said gain fiber twice, first in transit from the pump laser to the VCSEL, second in transit from the VCSEL to the output port.

16. An improved laser source according to claim 15 wherein said pump laser is a pulse laser, and said multiplexer is adapted to alternately inject pump laser pulses into said VCSEL and to pass said amplified VCSEL laser beam to said output port.

* * * * *